United States Patent [19]
Da Costa

[11] Patent Number: 5,105,246
[45] Date of Patent: Apr. 14, 1992

[54] LEAKY LOW VOLTAGE THIN FILM TRANSISTOR

[75] Inventor: Victor M. Da Costa, San Carlos, Calif.

[73] Assignee: Xerox Corporation, Stamford, Conn.

[21] Appl. No.: 566,015

[22] Filed: Aug. 10, 1990

[51] Int. Cl.⁵ .................... H01L 27/01; H01L 27/12; H01L 29/40
[52] U.S. Cl. ..................................... 357/23.7; 357/4; 357/41; 357/53
[58] Field of Search .................. 357/23.7, 4, 23.12, 357/41, 53

[56] References Cited

U.S. PATENT DOCUMENTS 4,963,955  10/1990  Hatanaka et al. .................. 357/23.7

FOREIGN PATENT DOCUMENTS

| 52-28882 | 3/1977 | Japan | 357/23.7 |
| 53-114683 | 6/1978 | Japan | 357/23.7 |
| 63-151083 | 6/1988 | Japan | 357/23.7 |
| 1-91468 | 4/1989 | Japan | 357/23.7 |

Primary Examiner—Andrew J. James
Assistant Examiner—Ngan Van Ngo

[57] ABSTRACT

A leaky thin film transistor including a charge transport layer, source and drain electrodes located adjacent to the charge transport layer, a gate electrode spaced from the charge transport layer by a gate dielectric layer, the gate electrode defining a gated portion of the charge transport layer extending between the source electrode and the drain electrode, and an ungated portion of the charge transport layer extending between the source and drain electrodes and providing an electrical path for leakage current to flow between the source and drain electrodes in parallel with the gated path between the source and drain electrodes.

6 Claims, 5 Drawing Sheets

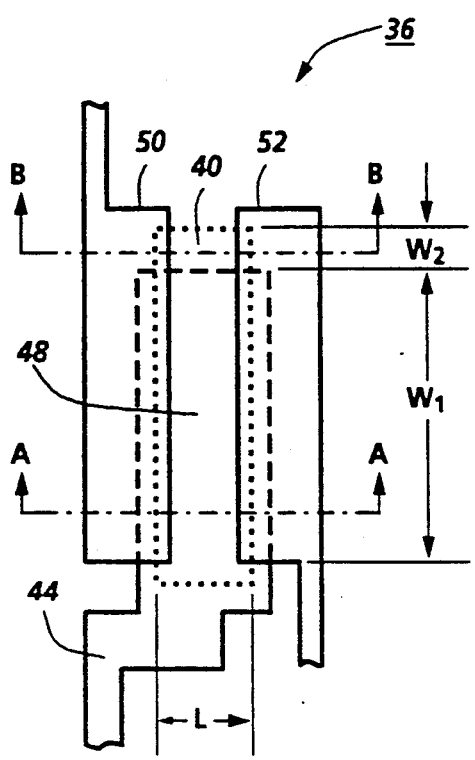
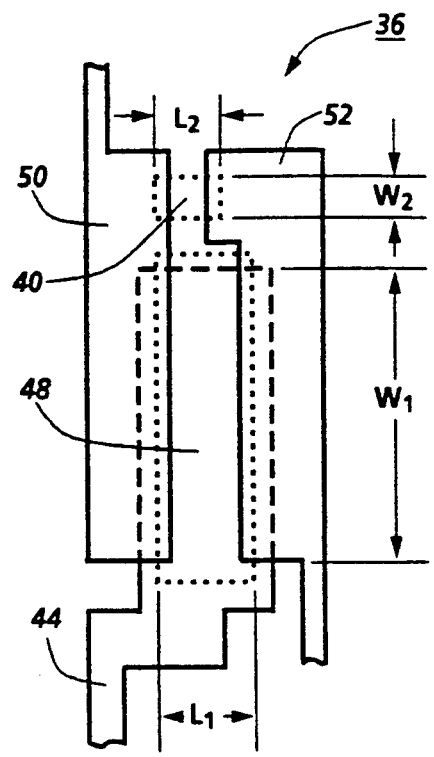
Fig. 6
Fig. 8
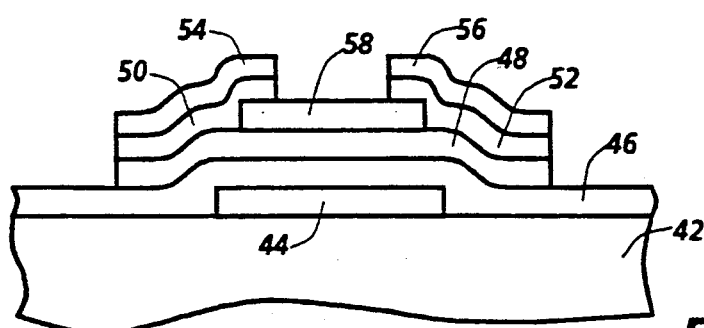
Fig. 7A
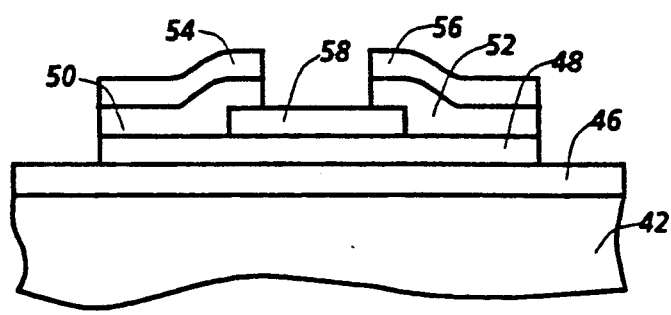
Fig. 7B

LEAKY LOW VOLTAGE THIN FILM TRANSISTOR

FIELD OF THE INVENTION

This invention relates to an improved thin film transistor (LVTFT) having an integral parallel shunt path through which space charge limited current flows.

BACKGROUND OF THE INVENTION

In may copending patent application entitled "Space Charge Current Limited Shunt in a Cascode Circuit for HVTFT Devices" filed concurrently herewith identified by application Ser. No. 565,767, now U.S. Pat. No. 5,073,723, and assigned to the same assignee, I have described an improved printing circuit for high speed and high voltage applications which incorporates my novel leaky low voltage thin film transistor. In that application it is suggested that the cascode circuit of that invention be incorporated into the electrographic writing head 10 schematically illustrated in FIG. 1.

Such a writing head, manufacturable by thin fabrication techniques, is fully disclosed in U.S. Pat. No. 4,588,997. The writing head 10 comprises a linear array of several thousand styli 12 for generating sequential raster lines of information by means of high voltage electrical discharges across a minute air gap to a conductive electrode. In order to drive selected styli in the array, a multiplexing scheme is used wherein the charge on each stylus is controlled by a low voltage thin film pass transistor 14 which selectively charges and discharges the gate of a thin film high voltage transistor 16 for latching the HVTFT. This scheme allows each stylus to maintain its imposed charge, for substantially a line time, between charges and discharges. The drain electrode 18 of HVTFT 16 is connected to high voltage bus 20 (maintained at about 450 volts relative to ground) via load resistor 22, and its source electrode 24 is connected to ground bus 26. Data signals, from data lines 28, on the order of 20 volts (ON) and 0 volts (OFF) will be imposed upon the gate electrode of the HVTFT when the address line 30 switches the gate of LVTFT 14 between about 24 volts (ON) and 0 volts (OFF) during a "gate time" of about 15 to 25 μsec, i.e. the time it takes for the gate of the HVTFT to reach its desired potential.

Writing takes place in electrography when the potential difference between the stylus 12 and a biased complementary electrode (not shown) is sufficient to break down the air gap therebetween. In one form of this art, the complementary electrode is biased to a potential of several hundred volts. In the ON state of the HVTFT 16 writing will take place because the stylus will achieve a low potential so that the difference between it and the complementary electrode is high enough to cause air gap breakdown. When the HVTFT is ON, a current path exists from the high voltage bus 20 to ground through the HVTFT, and the large voltage drop across the load resistor 22 will cause the potential on the stylus 12 to approach ground (typically about 10 volts). In the OFF state of the HVTFT no writing will occur because no current path exists from the high voltage bus to ground, there will be no potential drop across the load resistor, and a high potential (of about 450 volts) will be applied to the stylus 12.

A switching problem arises with this circuit because of the parasitic capacitance between the drain electrode 18 and the gate electrode 32 of the HVTFT induced by the rapid switching of the LVTFT during a gate time. In attempting to turn OFF the HVTFT, its parasitic capacitance tends to raise the voltage of its gate electrode and starts to switch it ON. The result is that the drain electrode (and the stylus) will achieve about 200 to 250 volts rather than the intended 450 volts because the HVTFT doesn't turn fully OFF. Therefore, the stylus will write gray rather than white (non-write).

As set forth in my copending application, a known solution to the switching efficiency problem caused by gate-to-drain parasitic capacitance is the use of a cascode circuit wherein the switching transistor is connected in series with the switched transistor and the gate of the switched transistor is biased to a fixed potential. However, when this solution is applied to an amorphous silicon HVTFT (switched transistor) it triggers an instability in the device which shifts the $I_{DS}$ vs. $V_{DS}$ characteristic curve to the right over time. This instability is characterized by a parameter $V_X$, and the resulting curve is said to be $V_X$ shifted. In FIG. 3, curve A represents an initial (unstressed) condition and curve B represents a $V_X$ shifted condition. This phenomenon occurs when the gate to source voltage ($V_{GS}$) is much below threshold ($V_{TH}$), as would be the case with a hard OFF condition (see FIG. 4). As a consequence, the output low voltage of the HVTFT (note loadline C based upon a pullup resistor 22 of 450 MegΩ crossing the characteristic curves A and B) increases with time (from about 8 volts to about 80 volts), preventing its switching over the entire 450 volt range, and therefore, in the ON state writing gray rather than white. This phenomenon is discussed in copending patent application U.S. Ser. No. 07/366,822 (Yap) filed on June 15, 1989, hereby fully incorporated by reference. The problem is exacerbated as the differential between the OFF state gate voltage and the threshold voltage increases, and no instability occurs at gate voltages just below the threshold of the HVTFT (in the range form about 0.5 to 1 volt). It is the normally higher OFF state leakage current of the HVTFT than the switching LVTFT which gives rise to this problem.

It is the primary object of the present invention to provide a leaky thin film LVTFT having a shunt path through which space charge limited current flows.

SUMMARY OF THE INVENTION

The present invention may be carried out, in one form, by providing a leaky thin film transistor including a charge transport layer, source and drain electrodes located adjacent to the charge transport layer, a gate electrode spaced from the charge transport layer by a gate dielectric layer, the gate electrode defining a gated portion of the charge transport layer extending between the source electrode and the drain electrode, and an ungated portion of the charge transport layer extending between the source and drain electrodes and providing an electrical path for leakage current to flow between the source and drain electrodes in parallel with the gated path between the source and drain electrodes.

BRIEF DESCRIPTION OF THE DRAWINGS

Other objects and further features and advantages of this invention will be apparent from the following, more particular, description considered together with the accompanying drawings, wherein:

FIG. 6 is a schematic plan view of the leaky LVTFT, FIGS. 7A and 7B are schematic sectional views taken substantially in the along lines A—A and B—B of FIG. 6, showing gated and ungated portions of the device, FIG. 8 is a schematic plan view of an alternative form of the leaky LVTFT.

DETAILED DESCRIPTION OF THE ILLUSTRATED EMBODIMENTS

Figure 1:
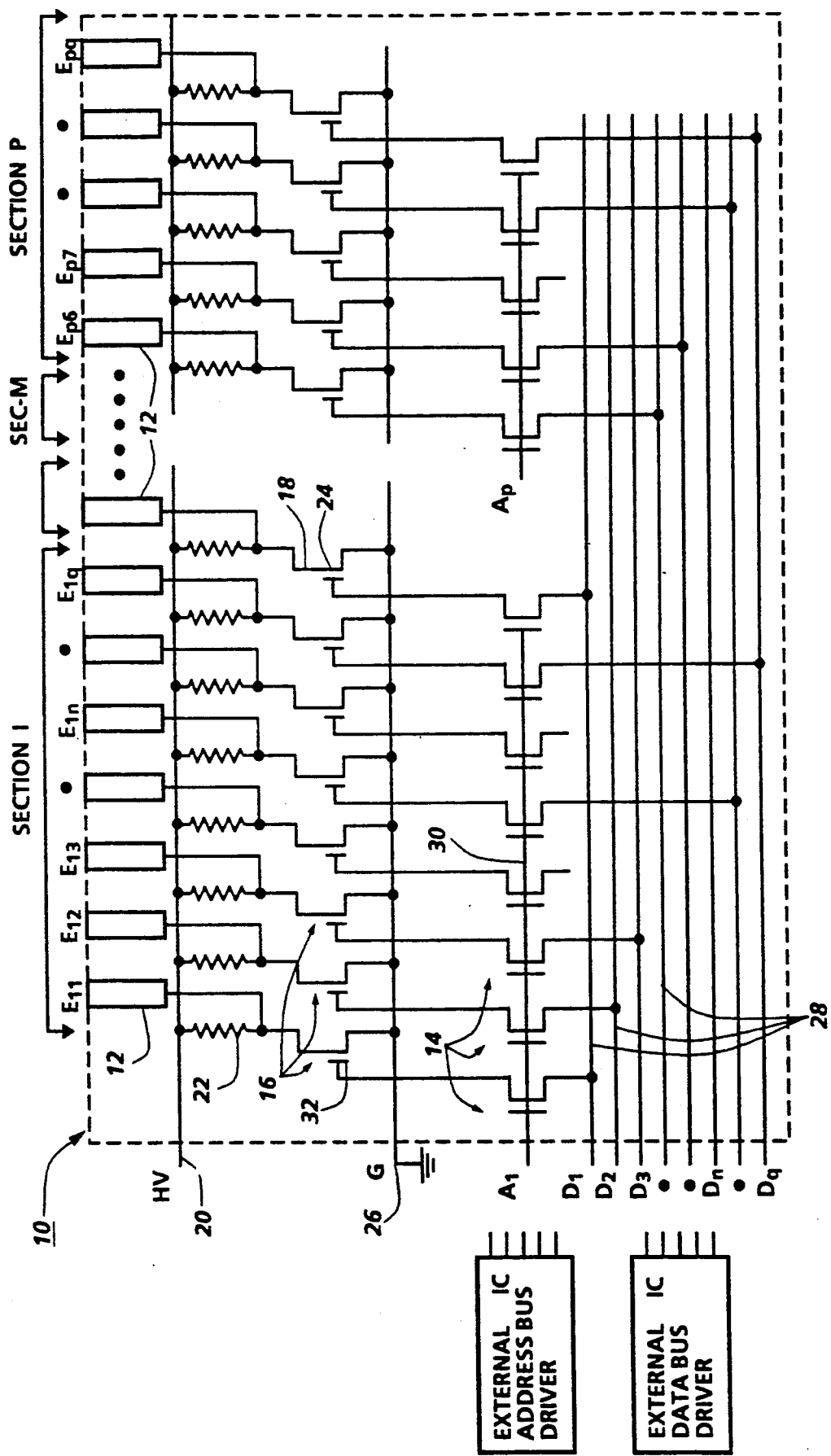
FIG. 1 is a schematic representation of an integral thin film writing head.
Figure 2:
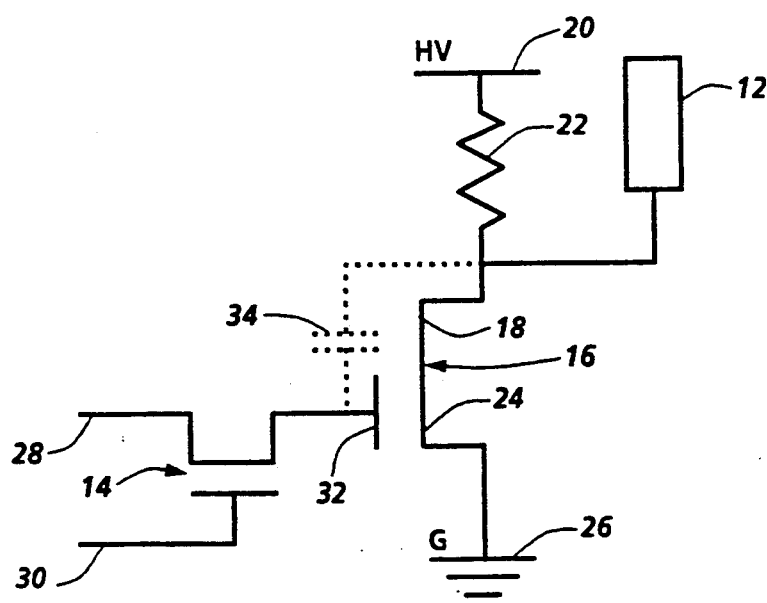
FIG. 2 is a schematic representation of a single cell of the array of FIG. 1.
Figure 3:
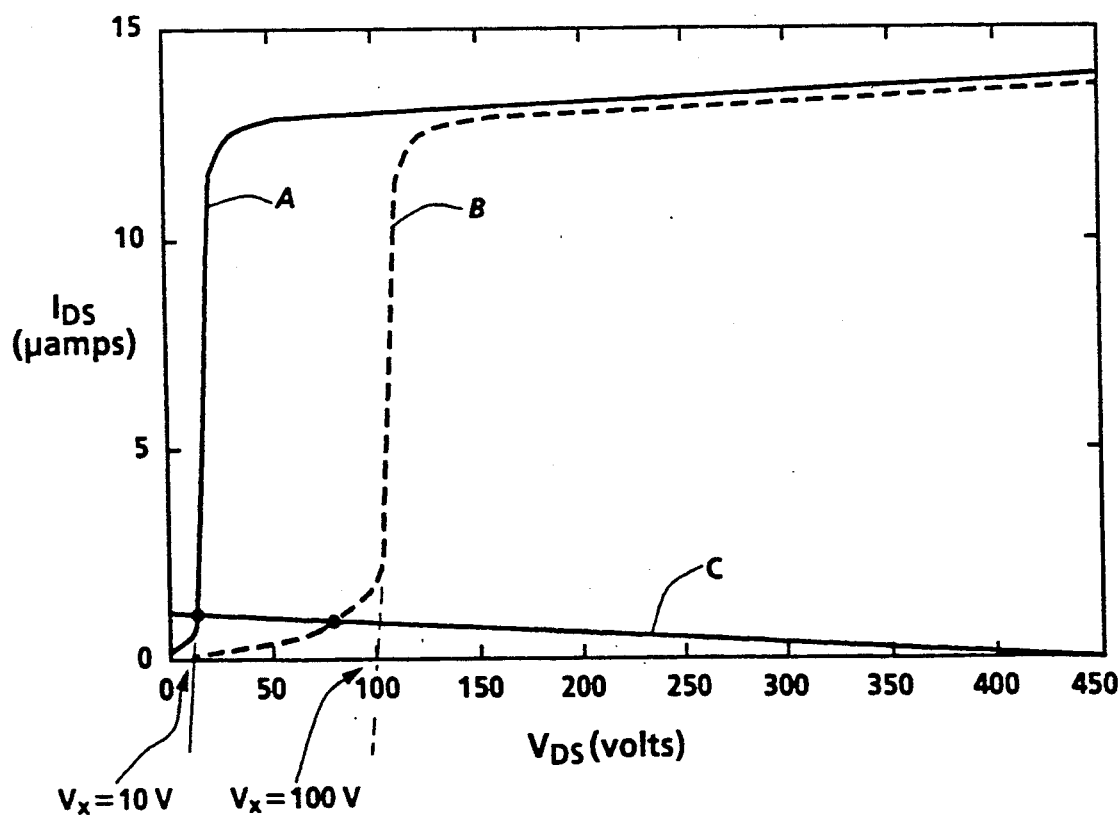
FIG. 3 illustrates characteristic $I_{DS}$ vs. $V_{DS}$ curves of an amorphous silicon HVTFT showing the $V_X$ shift.
Figure 4:
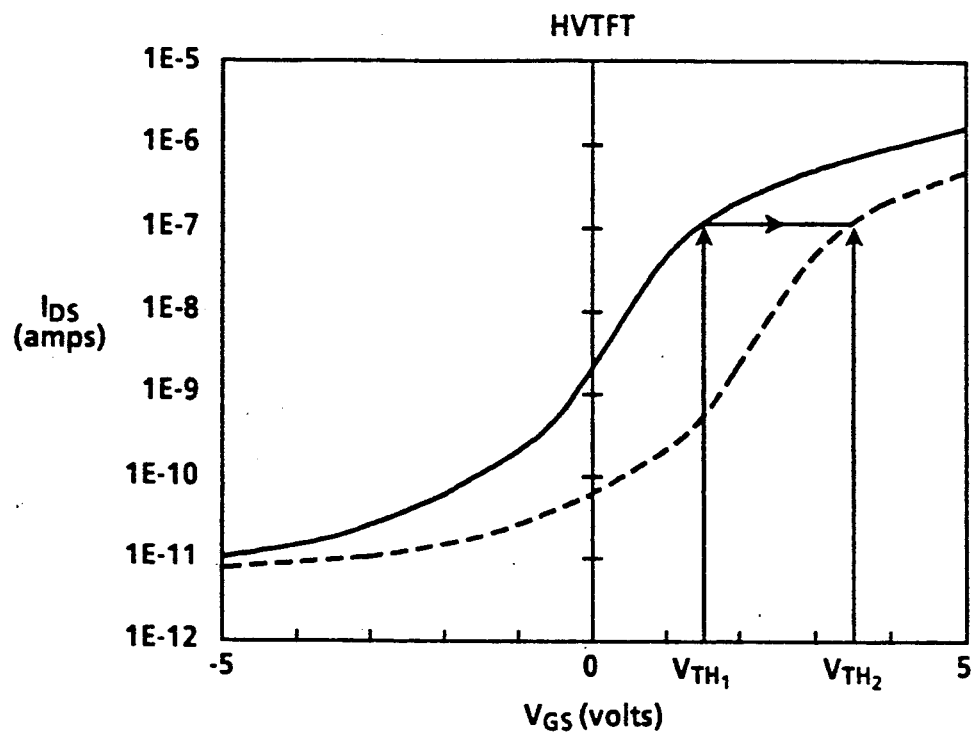
FIG. 4 illustrates characteristic $I_{DS}$ vs. $V_{GS}$ curves of an amorphous silicon HVTFT showing the threshold voltage ($V_{TH}$) shift.
Figure 5:
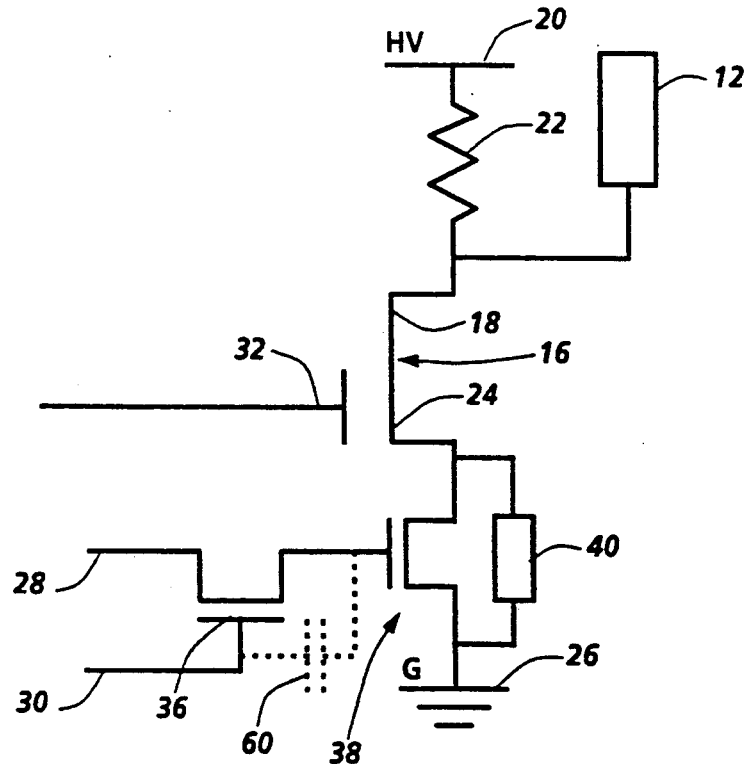
FIG. 5 is a schematic representation of a single cell of an improved cascode drive circuit incorporating the leaky LVTFT of the present invention.

The cascode circuit illustrated in FIG. 4 comprises a low voltage thin film pass transistor 36 and a leaky low voltage thin film switching transistor 38 for switching the source electrode potential of the HVTFT in order to turn the device ON and OFF while maintaining a fixed potential on the gate electrode 30 of the HVTFT. The floating gate of the switching LVTFT is completely isolated from the large voltage swings of the HVTFT drain, therefore, the switching efficiency problem of that device is eliminated. Additionally, the leaky LVTFT 38 is provided with a space charge limited shunt 40 in parallel with the switching transistor for insuring a leakage path to the reference potential in order to prevent the $V_X$ shift in the HVTFT, as will become apparent hereinafter. It can be seen in FIGS. 6, 7A and 7B that the novel leaky LVTFT 38 is basically a standard amorphous silicon LVTFT comprising a substrate 42, a conductive gate electrode layer 44, a gate dielectric layer 46, a substantially intrinsic amorphous silicon charge transport layer 48, doped (n+) amorphous silicon source and drain electrodes 50 and 52, conductive source and drain contacts 54 and 56, and top dielectric layer 58. The amorphous silicon layer 48 and the source and drain electrodes 50 and 52 extend beyond the gate electrode 42 in the region of section B—B so as to provide an ungated portion of the amorphous silicon charge transport island having a current path parallel to the gated current path of the transistor. Whenever there is a potential drop between the source electrode and the drain electrode, space charge limited current will flow thereacross in the ungated region.

The novel shunted thin film transistor is easily fabricated, requiring the identical processing steps necessary for fabrication of the conventional transistor. Typically, the LVTFT comprises the following:

Gate electrode 44 (chrome #1) = 1 μm,
Gate dielectric 46 (bottom nitride) = 3000Å,
Charge transport layer 48 (intrinsic a-Si) = 500Å,
Passivation layer 58 (top nitride) = 1500Å,
Source and drain electrodes 50,52 (n+a-Si) = 2000Å,
Source and drain contacts 54,56 (chrome #2) = 1 μm.

The lateral distance between the contacts of the source and drain electrodes with the charge transport layer defines the channel length L and the transverse distance between the source and drain electrodes defines the channel width W. It is well known that in addition to the material characteristics, the dimensions of the transistor channel determines its ON current. For a given source to drain bias condition, current is inversely proportional to channel length (L) and directly proportional to channel width (W). In conventional LVTFTs, L would be about 20 μm and $W_1$ would be about 50 μm to 100 μm. By extending the width of the amorphous silicon charge transport island 48 by about 7 μm ($W_2$) and the source and drain electrodes 50 and 52 a commensurate amount beyond the end of the gate electrode I provide an ungated portion of the channel through which space charge limited current flows.

It is possible to tailor the dimensions of the shunt 40 in order to obtain the leakage current needed for a particular application. Since the ungated shunt determines the OFF state leakage, the choice of shunt dimension depends upon the amount of leakage needed with respect to the device with which it is connected in series. The simplest dimensional modification is extension of the width $W_2$. It has been found that leakage current scales linearly with such a change, but it is usually logarithmic changes (note FIG. 4) that are significant. Very small widths of 2 μm and 3 μm were found to insure the amount of leakage needed for the HVTFTs in the cascode circuits tested, nevertheless it was decided to use 7 μm in order to allow for misalignments on the order of ±4 μm or 5 μm and still have a sufficient ungated region for satisfactory leakage current flow. By proper masking, the ungated channel length $L_2$ (note FIG. 8) may be altered to increase the leakage current by being shortened, or to decrease the leakage current by being lengthened.

Although the cascode circuit solution is well known for overcoming the switching efficiency problem caused by parasitic capacitance, its implementation in amorphous silicon raises the specter of the $V_X$ shift phenomenon. In this circuit, the fundamental concept is that the current through the series connected HVTFT 16 and its switching LVTFT will be identical. This is true not only in the ON state of the LVTFT but also in its OFF state, wherein the leakage current through the devices will be matched. The typically higher leakage current through the HVTFT than through the conventional switching LVTFT will always cause the OFF state $V_{GS}$ of the HVTFT to be much below its threshold voltage, thereby inducing a hard OFF condition which results in the $V_X$ shift instability. The rate at which $V_X$ shifts is strongly dependent upon the magnitude of that differential and the length of time that the hard OFF condition exists. If the gate voltage can be maintained just below the threshold voltage of the HVTFT (by about 0.5 volts) degradation will not occur. I have found that the HVTFT may be made more stable with the introduction of the leaky LVTFT 38 having a parallel space charge limited shunt 40. This novel device is more leaky than the HVTFT and not only prevents the $V_X$ shift from occurring in the HVTFT, by avoiding the hard OFF state which puts the device into an unstable condition, but actually makes the circuit more stable under all conditions.

Figure 10:
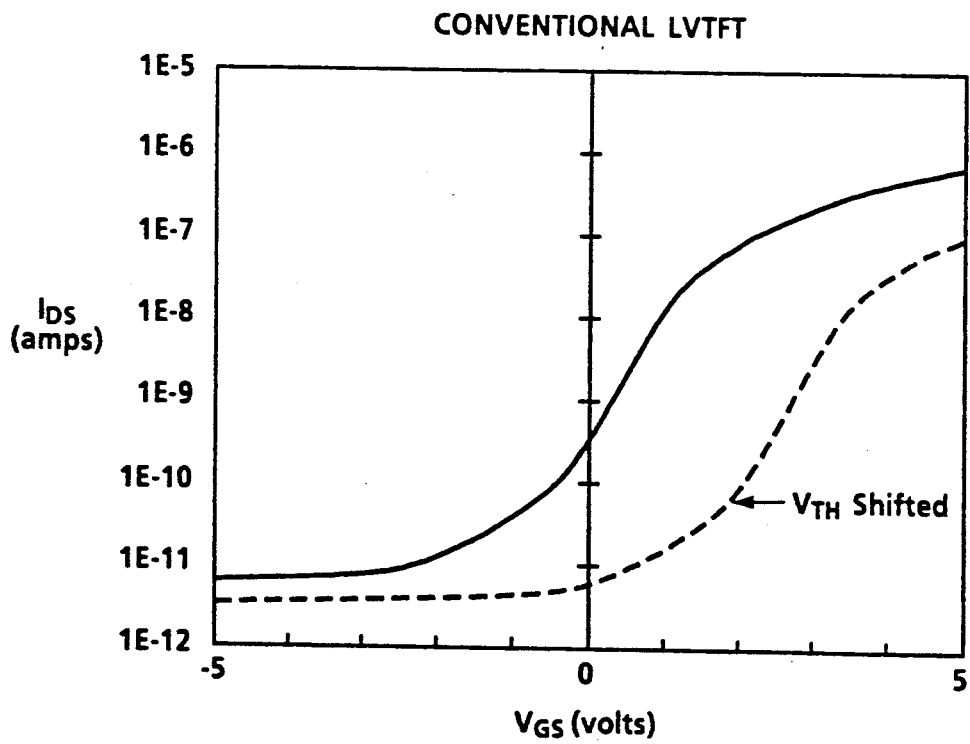
FIG. 10 illustrates characteristic $I_{DS}$ vs. $V_{GS}$ curves of a conventional amorphous silicon LVTFT.

Another problem exhibited by amorphous silicon transistors is a threshold voltage shift which occurs during normal usage in both high voltage and low voltage TFTs. The threshold voltage shift phenomenon in amorphous silicon transistors normally aggravates the $V_X$ instability problem in the HVTFT. It can be seen in FIGS. 4 and 10 that as $V_{TH}$ increases, the characteristic $I_{DS}$ vs. $V_{GS}$ curves shift to the right over time and higher gate voltages will be needed to turn the device ON. For example, when the HVTFT device is new, $V_{TH}$ is typically about 1.5 volts. As the device is stressed during usage over time, $V_{TH}$ could rise by 2, 3 or more volts (2 volts illustrated in FIG. 4). A $V_{TH}$ shift in the LVTFT will cause the OFF current at $V_{GS}=0$ volts to drop substantially (from about $10^{-9.5}$ to about $10^{-11.2}$ amps). In a cascode circuit wherein currents through the HVTFT and LVTFT will be matched, this decreased OFF current through the HVTFT will cause $V_{GS}$ to be very much lower than the upwardly shifted threshold voltage. As a result, the HVTFT will undergo further stress and drive the $V_X$ shift further to the right.

Figure 9:
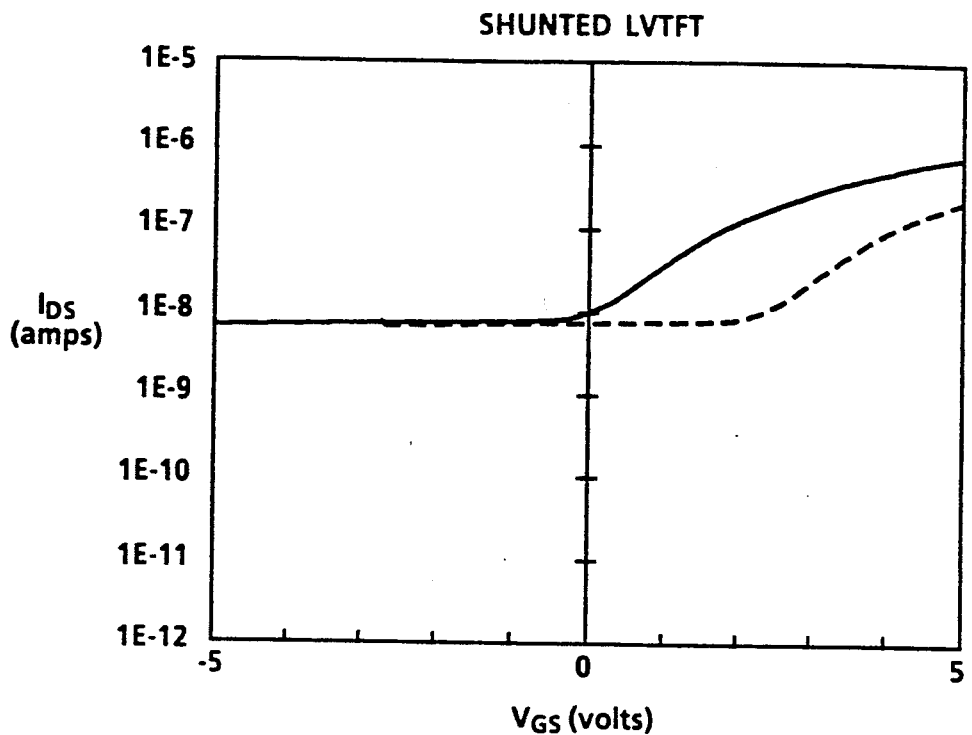
FIG. 9 illustrates characteristic $I_{DS}$ vs. $V_{GS}$ curves of the leaky LVTFT of FIG. 6.

The space charge current limited shunt 40 in parallel with the switching transistor will insure that the leaky LVTFT 38 always leaks much more than does the HVTFT 16. Therefore, as the circuit seeks to achieve a state where the leakages through the two series connected transistors match, the gate to source potential of the HVTFT will be prevented from dropping far below its threshold voltage (no greater than about 1 volt less than $V_{TH}$). Turning to FIGS. 4 and 9, it can be seen that when the leaky switching transistor 36 is turned OFF at 0 volts the current flowing through it is about $10^{-8}$ amps. The matching current through the HVTFT 16 will yield a gate potential of about 0.5 volts. Since the gate potential is about 1 volt below its threshold voltage, the $V_X$ shift will be minimized or possibly prevented. As to the effect of parasitic capacitance 38 which drives the gate of the switching transistor to about $-4$ volts rather than 0 volts, it can be seen in FIG. 8 that the leakage current will remain virtually the same. Similarly, as the novel leaky LVTFT undergoes a threshold voltage shift to the right, over time, the leakage current will remain virtually the same.

This leaky LVTFT may be used when controlling an amorphous silicon-like series connected device by switching current therethrough. The relatively high and flat response at negative gate voltages shown in FIG. 9 indicates that in the OFF state of the leaky LVTFT the shunt prevails over the leakage current of the gated region and will therefore determine the OFF state current independently of threshold changes. Thus, the OFF state leakage response of this novel device insures that in the OFF state, $V_{GS}$ of the companion device is at a point determined by the space charge limited current through the shunt, and therefore tracks the upwardly shifting threshold of that device. In the ON state, circuit operation will not be affected since the ON current will be orders of magnitude greater that the parallel current shunt.

It should be understood that the present disclosure has been made only by way of example and that numerous changes in details of construction and the combination and arrangement of parts may be resorted to without departing from the true spirit and the scope of the invention as hereinafter claimed.

What is claimed is:

1. A leaky thin film transistor including a charge transport layer, source and drain electrodes located adjacent to said charge transport layer, said source and drain electrodes being separated in a lateral direction by a channel length dimension, a gate electrode spaced from said charge transport layer by a gate dielectric layer, said gate electrode defining a gated portion of said charge transport layer extending between said source electrode and said drain electrode, the improvement comprising an ungated portion of said charge transport layer extending between said source and drain electrodes and providing an electrical path for leakage current to flow between said source and drain electrodes in parallel with the gated portion of said charge transport layer extending between said source and drain electrodes, wherein the spacing between said source and drain electrodes adjacent said gated portion of said charge transport layer and the spacing between said source and drain electrodes adjacent said ungated portion of said charge transport layer are non-equidistant.

2. A leaky thin film transistor including a charge transport layer, laterally spaced source and drain electrodes located adjacent to said charge transport layer, a gate electrode spaced from said charge transport layer by a gate dielectric layer, said gate electrode defining a gated portion of said charge transport layer extending laterally from said source electrode to said drain electrode, the improvement comprising an ungated portion of said charge transport layer through which space charge limited leakage current will flow between said source and drain electrodes in a path parallel with said gated portion of said charge transport layer, wherein the spacing between said source and drain electrodes adjacent said gated portion of said charge transport layer and the spacing between said source and drain electrodes adjacent said ungated portion of said charge transport layer are non-equidistant.

3. The leaky thin film transistor as defined in claim 2 wherein said gated portion and said ungated portion of said charge transport layer are noncontiguous.

4. A leaky thin film transistor including a charge transport layer, source and drain electrodes located adjacent to said charge transport layer, said source and drain electrodes being separated in a lateral direction by a channel length dimension, a gate electrode spaced from said charge transport layer by a gate dielectric layer, said gate electrode defining a gated portion of said charge transport layer extending between said source electrode and said drain electrode, the improvement comprising an ungated portion of said charge transport layer extending between said source and drain electrodes and providing an electrical path for leakage current to flow between said source and drain electrodes in parallel with the gated portion of said charge transport layer extending between said source and drain electrodes, wherein said gated portion of said charge transport layer and said ungated portion of said charge transport layer are noncontiguous.

5. A leaky thin film transistor including a charge transport layer, laterally spaced source and drain electrodes located adjacent to said charge transport layer, a gate electrode spaced from said charge transport layer by a gate dielectric layer, said gate electrode defining a gated portion of said charge transport layer extending laterally from said source electrode to said drain electrode, the improvement comprising an ungated portion of said charge transport layer through which space charge limited leakage current will flow between said source and drain electrodes in a path parallel with said gated portion of said charge transport layer, wherein said gated portion of said charge transport layer and said ungated portion of said charge transport layer are noncontiguous.

6. The leaky thin film transistor as defined in claim 1 wherein said gated portion and said ungated portions of said charge transport layer are noncontiguous.

* * * * *